(12) United States Patent
Kobayashi

(10) Patent No.: US 6,771,805 B1
(45) Date of Patent: Aug. 3, 2004

(54) PERSPECTIVE VIEWING INSPECTION SYSTEM

(75) Inventor: Shigeki Kobayashi, Kyoto (JP)

(73) Assignee: Keiso Research Laboratories, Inc., Kyoto (JP)

( * ) Notice: Subject to any disclaimer, the term of this patent is extended or adjusted under 35 U.S.C. 154(b) by 445 days.

(21) Appl. No.: 09/680,215

(22) Filed: Oct. 6, 2000

(30) Foreign Application Priority Data

Oct. 6, 1999 (JP) .......................................... 11/285067

(51) Int. Cl.[7] ................................................ G06K 9/00
(52) U.S. Cl. ....................... 382/147; 382/149; 382/150; 382/151; 382/154
(58) Field of Search ................................. 382/145, 147, 382/149, 150, 151, 154, 155, 144, 146, 141; 348/126, 131; 356/237.4, 237.5

(56) References Cited

U.S. PATENT DOCUMENTS 6,111,602 A * 8/2000 Kim ............................ 348/92
6,490,368 B2 * 12/2002 Roder ......................... 382/147

* cited by examiner

Primary Examiner—Timothy M. Johnson
Assistant Examiner—Ali Bayat
(74) Attorney, Agent, or Firm—Smith, Gambrell & Russell, LLP

(57) ABSTRACT

Perspective viewing inspection system comprises a stage for holding a printed circuit board (PCB) mounted with electronic parts, teaching means for teaching position data and pose data of the PCB during inspection and also part electrode's addresses on the PCB, means for making an inspection program including layout of inspection areas, means for imaging the inspection areas of the PCB, means for evaluating part-mounting and soldering quality or means for displaying images captured therewith, and means for coordinating the whole system operations. The means for imaging involves an active vision system consisting of an active mirror, an active objective, an ocular, a zoom leans, and an imaging device enabling gaze at solder joints and capture of bird's eye perspective view images thereof. The stage is equipped with a PCB pose controller to orient the PCB at directions wherewith the means for imaging obtains the solder joint's angular perspective view images. Coordinated operations of the active vision system and the stage enable angular bird's eye perspective viewing of the solder joints. The perspective viewing inspection system utilizes angular bird's eye perspective images of solder joints for automatic inspection or display for visual inspection.

14 Claims, 13 Drawing Sheets

FIG. 1

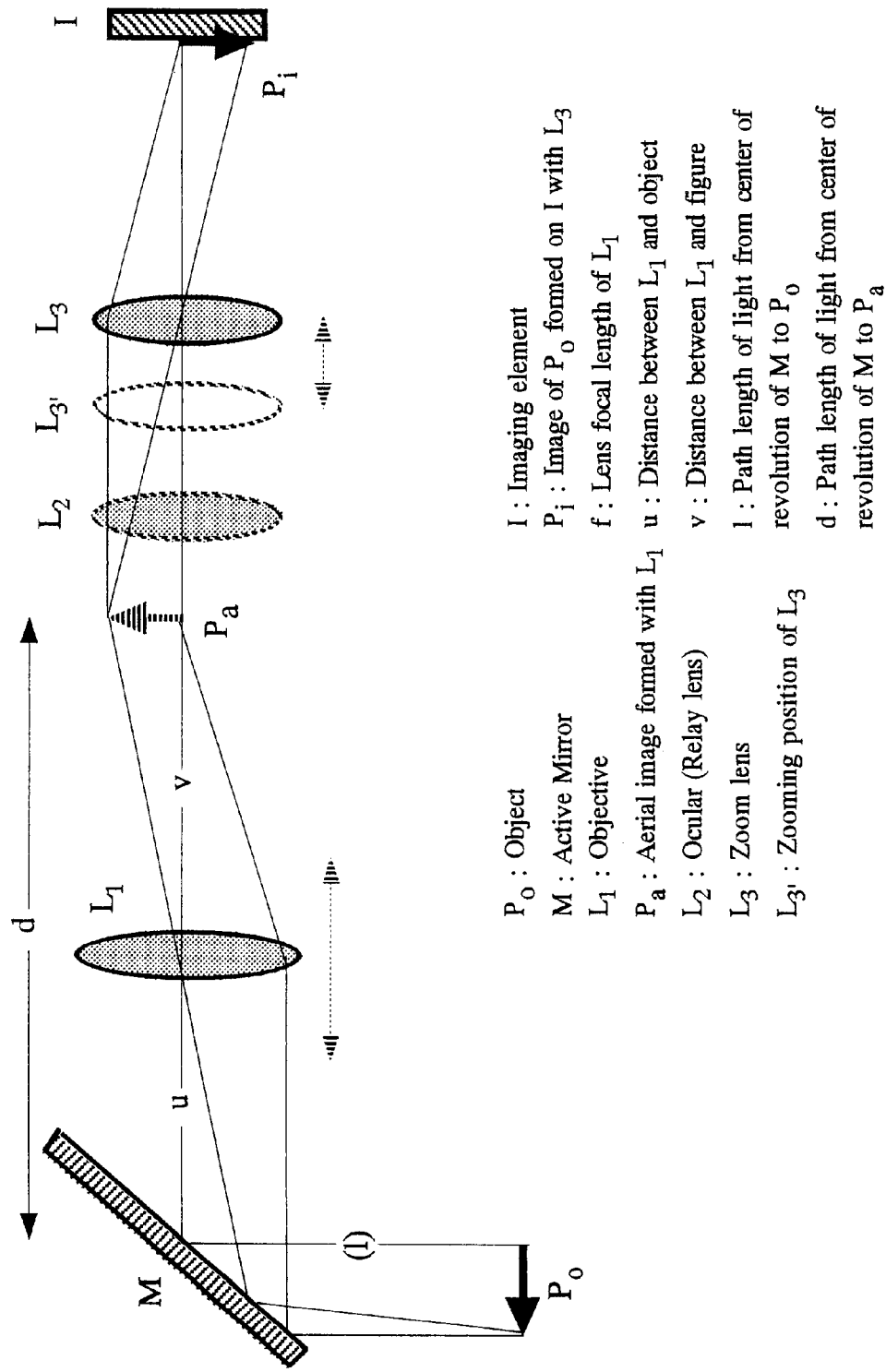

$P_O$ : Object
M : Active Mirror
$L_1$ : Objective
$P_a$ : Aerial image formed with $L_1$
$L_2$ : Ocular (Relay lens)
$L_3$ : Zoom lens
$L_{3'}$ : Zooming position of $L_3$ I : Imaging element
$P_i$ : Image of $P_O$ formed on I with $L_3$
f : Lens focal length of $L_1$
u : Distance between $L_1$ and object
v : Distance between $L_1$ and figure
l : Path length of light from center of revolution of M to $P_O$
d : Path length of light from center of revolution of M to $P_a$ M : Active Mirror
$L_1$ : Objective
$P_o$ : Object
$(x_w, y_w, z_w)$ : World coordinate system
$O_w$ : Origin of world coordinate system
$\phi$ : Rotation about $z_w$ axis
$P_a$ : Aerial image
$(x_a, y_a, z_a)$ : Coordinate system attached to $P_a$
$P_a{}'$ : Virtual aerial image
$(x_a{}', y_a{}', z_a{}')$ : Coordinate system attached to $P_a{}'$
P : Object plane
$(x_o, y_o, z_o)$ : Object centered coordinate system FIG. 7
A
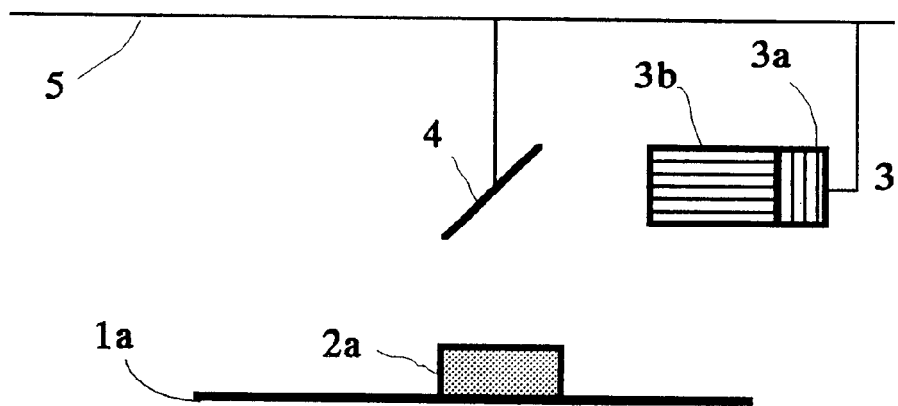
B
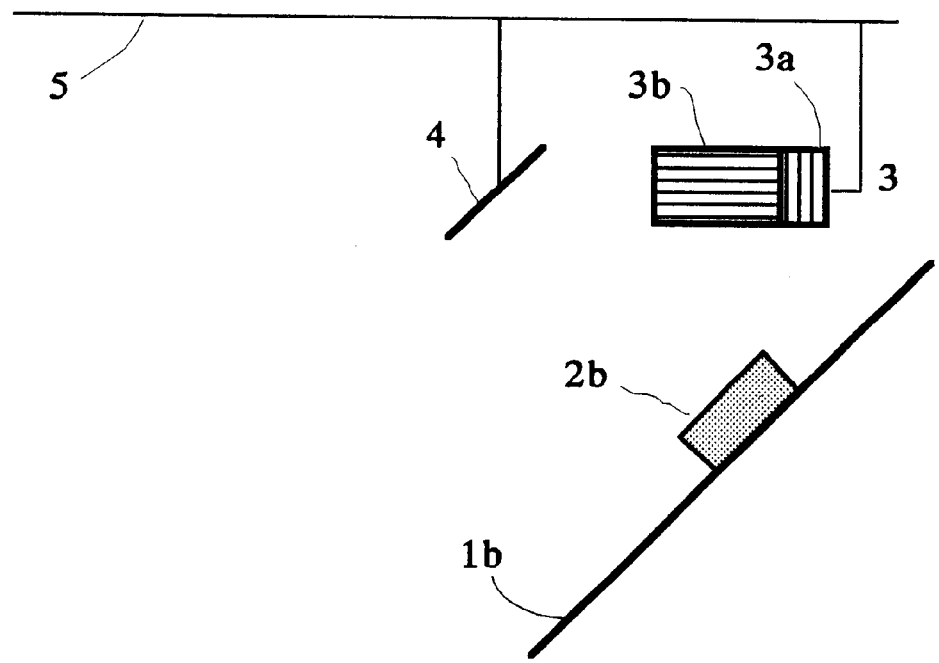

FIG. 13
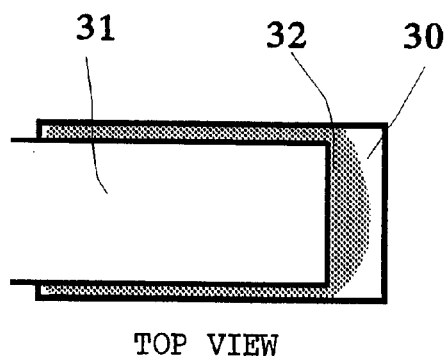
TOP VIEW
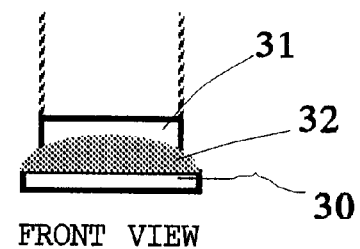
FRONT VIEW
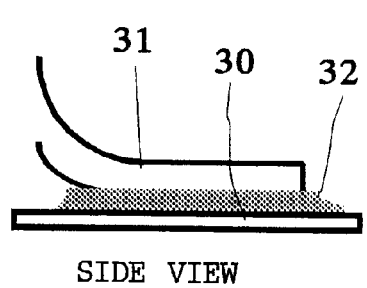
SIDE VIEW
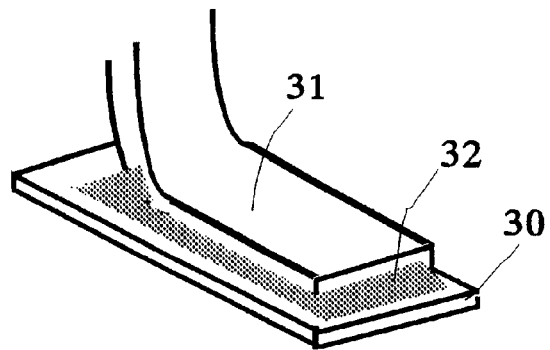
ANGULARE BIRD'S EYE
PERSPECTIVE VIEW

PERSPECTIVE VIEWING INSPECTION SYSTEM

BACKGROUND OF THE INVENTION

This invention relates to a perspective viewing system for automatic or visual soldering inspection wherein inspection of solder joints or display of solder joint images is performed utilizing angular bird's eye perspective view images of solder joints of electronic parts mounted on a printed circuit board (PCB). The angular bird's eye perspective view is attained by coordinated operations of an active vision system and a stage. In accordance with data taught, the active vision system views the board by bird's eye perspective angles while the stage holds it in a pose presenting angular aspect to the active vision system.

Visual inspection of electronic products has been done with naked eyes or using a stereoscopic microscope, but with advanced miniaturization of parts, human inspection has become increasingly more difficult and more unreliable. Hence, demands for the automation have emerged nowadays to raise reliability and to save human cost.

Many kinds of apparatuses for automatic soldering inspection of electronic parts have been developed and already used in assembly lines. However, they have still problems not only in their external properties, for example, the bigger sizes, the heavier weights, and the higher costs than what had been expected but also in their inferior recognition ability as compared with humans. Their imperfect recognition is in close relationship with difficulties in tuning the discriminative parameters. Thus, problems in conventional apparatuses still remain to be solved.

Conventional machines were based on a variety of three-dimensional image measurement techniques, but their optical principles were common in their viewing directions. They fixed their view directions in an angle either vertical or very acute to objects (less than approximately 10°). As the result, they could not obtain but a top view or an almost top view of a solder joint for recognition. Their vertical viewing direction was a common deficit causing inferior recognition and difficulty in fine tuning. Depicted schematically in FIG. 13 is a typical top view image of a solder joint 32 produced between a printed pattern 30 and an LSI electrode tip 31.

The reason why they commonly and exclusively adopted a vertical view was that they had to use a magnifier lens to distinguish minimal differences in solder shapes. As an essential feature of a magnifier lens, the focal length is so short and focusing depth is so shallow that inspection apparatuses to date were subjected to a vertical view and forced to give up an oblique, perspective view. (A perspective view is attained with a lens of long focal length.)

It is generally accepted that we cannot obtain satisfactory information on three-dimensional shape only from. the top view. We experience this in our daily life—we cannot know shape of a house from an aerial photo showing only the roof. A study of information theory has analyzed this relationship (see Reference 1: Kato, T., Sato, Y., and Shimizu, A., "Selecting view direction based on range maps" (in Japanese), Technical report of Inst.Electron.Inf.Com.Eng., IE90-1, 1~8, 1990).

OBJECTS OF THE INVENTIONS

As the paper (Reference 1) analyzed it, information quantity obtainable from an image of a three-dimensional object depends largely upon the viewing direction. This is also true for human inspection of solder joints. A drop of solder fixes an electrode to a pad of a printed circuit pattern mainly at the bottom. Shape of solder fillets wetting the front and sides of an electrode reflects the soldering quality.

An inspector holds a board by hand, tilts it, and turns it under an illuminating light in order to discriminate solder shapes. This performance signifies nothing but an effort to obtain maximal amount of information from appearance. He/she looks obliquely down at part's electrodes on a tilted and/or turned PCB, thus achieving an angular bird's eye perspective view of solder joints.

Prior art of an active vision inspection apparatus with mirror motion was disclosed in Japan Patent Application No. Thkuganhei 8-20728 filed by the inventor. Following the prior art, the present invention intends to introduce an inspection system for parts-mounted and soldered PCBs wherein angular bird's eye perspective view images are utilized for automatic or visual recognition.

An object of the present invention is to provide a perspective viewing inspection system capable of utilizing angular bird's eye perspective view images of solder joints (as depicted in an angular bird's eye view diagram of FIG. 13) for automatic discrimination, replacing top viewing of conventional techniques.

Another object of the present invention is to provide a perspective viewing inspection system capable of acquiring angular bird's eye perspective view images of solder joints to display them on a monitor screen for visual image inspection.

SUMMARY OF THE INVENTION

In accordance with a feature of the present invention, a perspective viewing inspection system comprises a stage for holding a PCB mounted with electronic parts, teaching means for teaching position data and pose data of the PCB during inspection and also part electrodes' addresses on the PCB, means for making inspection sequence programs, means for imaging, and means for evaluation, wherein said means for imaging includes an active vision system for acquiring bird's eye perspective view images of the PCB and wherein said stage is equipped with a PCB pose controller for orienting the PCB at such an angle that said active vision system may obtain its angular perspective views, enabling angular bird's eye perspective view imaging of solder joints for automatic evaluation of soldering quality.

In accordance with another feature of the present invention, a perspective viewing inspection system comprises a stage for holding a PCB mounted with electronic parts, teaching means for teaching position data and pose data of the PCB during inspection and also part electrodes' addresses on the PCB, means for making inspection sequence programs, means for imaging, and means for display, means for superimposing markers on displayed inspection point images, and means for inputting results of visual image inspection, wherein said means for imaging includes an active vision system for acquiring bird's eye perspective view images of the PCB and said stage is equipped with a PCB pose controller for orienting the PCB at such an angle that said active vision system may obtain angular perspective views of the PCB, enabling display of angular bird's eye perspective view images of solder joints for visual image inspection.

BRIEF DESCRIPTION OF THE DRAWINGS

FIG. 1 illustrates schematically optical constitution of an active vision system involved in a perspective viewing inspection system of an embodiment of the present invention.

FIG. 7 are schematic side views of a PCB at a translated position (FIG. 7A) and in a tilted pose (FIG. 7B) involved in a perspective viewing inspection system of an embodiment of the present invention.

FIG. 13 illustrate schematically a top view, a frontal view, a side view, and a perspective view of a solder joint produced between an LSI electrode and a printed pad pattern.

DETAILED DESCRIPTION OF THE EMBODIMENTS

Figure 2:
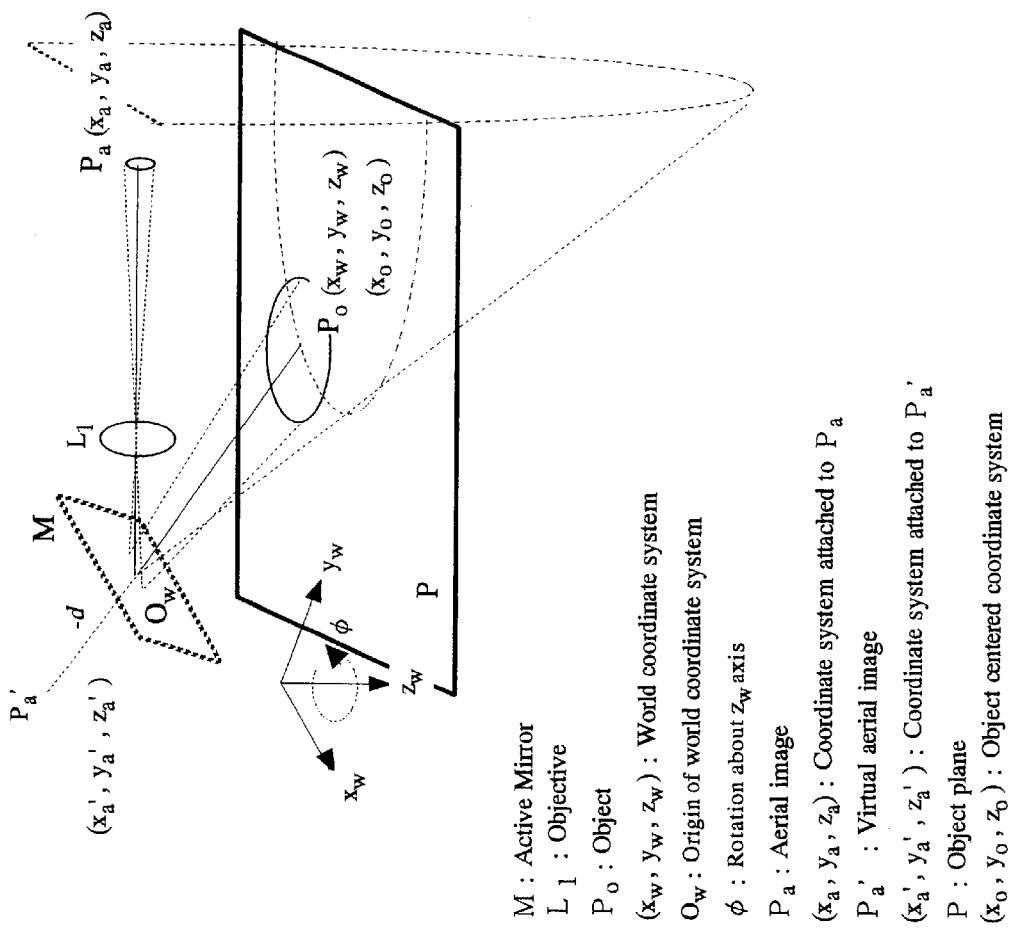
FIG. 2 is a diagram showing the geometrical relationship between the visual axis of the active vision system and an object for inspection involved in a perspective viewing inspection system of an embodiment of the present invention.

Optical constitution of an active vision system involved in embodiments of the present invention is illustrated schematically in FIG. 1. The geometry of the visual axis of the active vision system and an object for inspection is depicted in FIG. 2. The system constitution and horizontally turned poses of a PCB involved in first embodiment of the present invention are shown schematically in FIG. 3.

Before explaining first embodiment, the reason why that constitution is adopted for the active vision system of the present invention is to be described. A close-up lens or a microscope objective is generally used for obtaining images with resolution higher than scores of μm per pixel, but the lens focal length is too short for active vision application wherein the viewing axis should be directed at all directions. Therefore, embodiments of the present invention are equipped with a telescope-like optical system composed of an active objective having long lens focal length and an ocular.

Objective $L_1$ shown in FIG. 1 is active. Object $P_o$ positions at variable distances. Focusing at object $P_o$ is achieved by moving objective $L_1$ forward or backward along the optical axis. Objective $L_1$ forms aerial figure $P_a$ and ocular $L_2$ relays it to zoom lens $L_3$. The magnification is adjusted by zooming of zoom lens $L_3$ and then zoom lens $L_3$ projects object figure $P_i$ onto imaging element I.

The optical axis is held horizontal and mirror M is placed in front of objective $L_1$. Two pivots of revolution (not shown) hold mirror M so that the extended axes may cross orthogonally each other on the mirror surface. Mirror M is moved in azimuth and/or inclination to point the optical axis at object $P_o$.

The geometrical model is to be mentioned in two steps—the first is a step where objective $L_1$ forms aerial figure $P_a$ and the second is a step where ocular $L_2$ relays figure $P_a$. An active vision system using mirror reflection is optically equivalent to a system with an off-set virtual camera rotating around the centroid of the mirror. (See Reference 2: Murray, D. W., "Recovering range using virtual multicamera stereo", Computer Vision and Image Understanding, 61, (2), 285, 1995. and Reference 3: Tsunashima, N. et al, "Measuring the distance of objects using rotating mirror system" (in Japanese), Transactions of the Institute of Electronics, Information and Communication Engineers D-II, J81-D-II, (3), 501, 1998).

FIG. 2 shows an orthogonal coordinate system $(x_a, y_a, z_a)$ attached to aerial figure $P_a$ whose origin is the center of the image plane of $P_a$ and the $z_a$ axis is the viewing axis. As is shown in FIG. 1, the viewing axis is divided into two parts. The part from object $P_o$ to mirror M is 'active' in direction and accordingly variable in length. The another part from mirror M to imaging element I is horizontal and constant in length.

The origin $O_w$ of a world coordinate system $(x_w, y_w, z_w)$ is the center of revolution of mirror M. The $x_w$ axis is horizontal and vertical to the $y_w$ axis which is parallel to the horizontal optical axis. The $z_w$ axis is perpendicular and object plane P is held horizontal.

Rotation of the normal to mirror M by angle φ about the $z_w$ axis produces azimuth deflection of the viewing axis by angle 2φ. Rotation of the normal to mirror M by angle θ about the $x_w$ axis produces inclination deflection of the viewing axis by angle 2θ. Assuming that light from object $P_o$ goes straightforward across the origin $O_w$ with no mirror reflection, we image virtual aerial image $P_a'$ at $z_a'=-d$ that is equivalent to aerial image $P_a$. Motion of mirror M produces rotation of the normal about the respective axes of the world coordinate system as expressed in a virtual coordinate system $(x_a', y_a', z_a')$ which is attached to virtual image $P_a'$ (Expression 1);

$$\begin{pmatrix} x_a' \\ y_a' \\ z_a' \end{pmatrix} = R_\theta R_\varphi R_\phi \begin{pmatrix} x_w \\ y_w \\ z_w \end{pmatrix} + \begin{pmatrix} 0 \\ 0 \\ d \end{pmatrix}, \quad \text{Expression 1}$$

$$R_\theta = \begin{pmatrix} 1 & 0 & 0 \\ 0 & \cos 2\theta & -\sin 2\theta \\ 0 & \sin 2\theta & \cos 2\theta \end{pmatrix}$$

-continued $$R_\varphi = \begin{pmatrix} 1 & 0 & 0 \\ 0 & 1 & 0 \\ 0 & 0 & 1 \end{pmatrix}$$

$$R_\phi = \begin{pmatrix} \cos 2\phi & -\sin 2\phi & 0 \\ \sin 2\phi & \cos 2\phi & 0 \\ 0 & 0 & 1 \end{pmatrix}$$

($x_w$, $y_w$, $z_w$): The world coordinate system
($x_a'$, $y_a'$, $z_a'$): The virtual aerial image coordinate system
$R_\theta$: Rotation matrix about the $x_w$ axis
$R_\varphi$: Rotation matrix about the $y_w$ axis
$R_\phi$: Rotation matrix about the $z_w$ axis,
where $R_\theta$, $R_\varphi$, and $R_\phi$ are the rotation matrices about the $x_w$ axis, about the $y_w$ axis, and about the $z_w$ axis, respectively.

As is shown in FIG. 2, the aperture of objective $L_1$ produces a visual cone around the viewing axis projecting a elliptic view field onto object plane P.

Azimuth angle $\phi$ or inclination angle $\theta$ of mirror M moved so as to point the viewing axis at a world coordinate point ($x_w$, $y_w$, $z_w$) is given in the following Expression 2.

$$\phi = \frac{1}{2}\arctan\frac{x_w}{y_w} \quad \text{Expression 2}$$

$$\theta = \frac{1}{2}\arctan\frac{y_w}{z_w}$$

Moving mirror M only in azimuth under a fixed inclination forms a circular cone of the viewing axis in the world coordinate system whose vertex is the origin $O_w$ and the axis is the $y_w$ axis. As the result, changes in azimuth by angle $\phi$ about the $z_w$ axis for a given inclination angle $\theta$ draw a conic section on object plane P. The viewing angle $\alpha$ pointing to object $P_o$ is given in the following Expression 3, where h is the vertical distance from the origin $O_w$ to object plane P, and l is the path length from the origin $O_w$ to object $P_o$. The locus on P is a hyperbola because P is parallel to the axis of the circular cone.

$$\alpha = \arctan\frac{\sqrt{x_w^2 + y_w^2}}{h} \quad \text{Expression 3}$$

$$z_w = h$$

$$l = \sqrt{x_w^2 + y_w^2 + h^2}$$

Expression 4 is the lens formula of objective $L_1$, where u is the distance to the object point, v is the distance to the image point, and f is the lens focal length shown in FIG. 1.

$$\frac{1}{u} + \frac{1}{v} = \frac{1}{f} \quad \text{Expression 4}$$

In accordance with perspective projection, magnification $m_a$ of aerial image $P_a$ or magnification $m_a'$ of virtual aerial image $P_a'$ is given in Expression 5.

$$m_a = m_a' = \frac{v}{u} \quad \text{Expression 5}$$

Light from ocular $L_2$ passes through zoom lens $L_3$ and hits the surface of imaging element I as is shown in FIG. 1. Many reports on calibration of zoom lenses have accorded in a point that the lens model depends upon its special lens constitution including the distance to the image point. As for a model of zoom lens $L_3$, embodiments of the present invention utilize an empirical function obtained from experiments on magnifications and zooming pulses required therefor.

In embodiments of the present invention, magnification $m_a$ of aerial image $P_a$ varies in accordance with the distance to the object point, u. To attain constant magnification $m_i$ irrespective of the focal lengths, the zooming magnification $m_b$ is automatically adjusted according to the original magnification $m_a$ (Expression 6).

$$m_a m_b = m_i = \text{const.} \quad \text{Expression 6}$$

Thus, the active vision system of the present invention is able to acquire "bird's eye perspective views" of object $P_o$ by looking down at $P_o$ on object plane P.

Next, the object pose is to be mentioned. When object $P_o$ turns about the axes of an object centered coordinate system ($x_o$, $y_o$, $z_o$) by respective angles $\xi$, $\eta$, and $\zeta$, rotations about the corresponding axes of the world coordinate system is given in the respective rotation matrices of $R_\xi$, $R_\eta$, and $R_\zeta$ (Expression 7).

$$\begin{pmatrix} x_o \\ y_o \\ z_o \end{pmatrix} = R_\xi R_\eta R_\zeta \begin{pmatrix} x_w \\ y_w \\ z_w \end{pmatrix} + \begin{pmatrix} 0 \\ 0 \\ -l \end{pmatrix}, \quad \text{Expression 7}$$

$$R_\xi = \begin{pmatrix} 1 & 0 & 0 \\ 0 & \cos\xi & -\sin\xi \\ 0 & \sin\xi & \cos\xi \end{pmatrix}$$

$$R_\eta = \begin{pmatrix} \cos\eta & 0 & \sin\eta \\ 0 & 1 & 0 \\ -\sin\eta & 0 & \cos\eta \end{pmatrix}$$

$$R_\zeta = \begin{pmatrix} \cos\zeta & -\sin\zeta & 0 \\ \sin\zeta & \cos\zeta & 0 \\ 0 & 0 & 1 \end{pmatrix}$$

Therefore, the object's orientation with respect to the view angle of the active vision system is expressed in Expression 8.

$$\begin{pmatrix} x_a' \\ y_a' \\ z_a' \end{pmatrix} = R_\theta R_\varphi R_\phi R_\xi^T R_\eta^T R_\zeta^T \begin{pmatrix} x_o \\ y_o \\ z_o \end{pmatrix} + \begin{pmatrix} 0 \\ 0 \\ d-l \end{pmatrix} \quad \text{Expression 8}$$

($x_w$, $y_w$, $z_w$): The world coordinate system
($x_o$, $y_o$, $z_o$): The object coordinate system
$R_\xi$: Rotation matrix about the $x_w$ axis
$R_\eta$: Rotation matrix about $y_w$ axis
$R_\zeta$: Rotation matrix about $z_w$ axis Expression 8 gives a general relationship between a viewing angle of an active vision system and an object pose. A three-dimensional object exhibits its external feature better or worse depending upon its pose with respect to the viewer. In embodiments of the present invention, the stage is equipped with a PCB pose controller able to set a PCB in a pose presenting angular appearances of part electrodes where solder joints may expose themselves best to the vision system.

Figure 3:
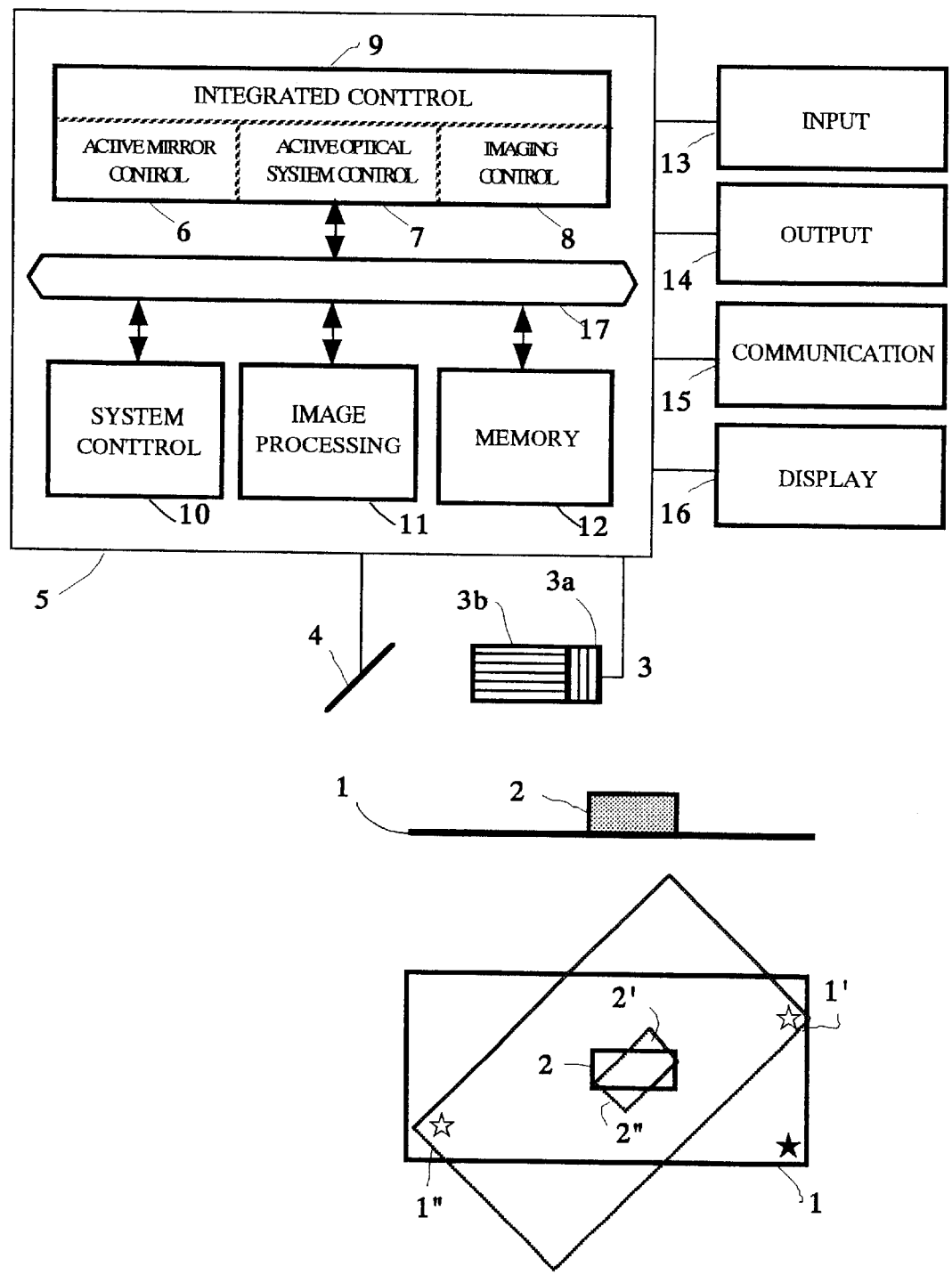
FIG. 3 is a schematic diagram showing system constitution and horizontally turned poses of a PCB involved in a perspective viewing inspection system of an embodiment of the present invention.

For inspection of a PCB mounted with comparatively flat parts such as LSIs or chips, the stage is equipped with a turntable. A PCB which is carried in from a manufacturing line is turned with the turntable horizontally about the centroid of the PCB. The turn as shown in FIG. 3 is given in $\zeta$ rotation of Expression 7. Angles of turn in usual inspection status are $\xi=\eta=0°$ and $\zeta=0°$, $45°$, or $-135°$. The turned PCB presents an "angular perspective view" of a part including front and side scenes of the electrode(s).

Combination of the bird's eye perspective view with the electrode angular view in embodiments of the present invention composes an angular bird'eye perspective view as is given in Expression 8 (see also FIG. 13) wherein the top, the front, and the side planes are seen at once. The study of information theory on polyhedral objects has proved that an image of a cube obtained in a direction viewing most planes with nearly uniform areas gives its maximal morphological information (Reference 1).

Most electrodes of surface mount parts are cuboid in shape. Therefore, morphological information of a soldered electrode image is also maximal in an angular bird's eye perspective view. Appearance of the front solder or the side solder reflects quantity, wettability, or a lifted lead and that of the top solder reflects excess solder or abnormal soldering.

Next, method of imaging a PCB mounted with tall atypical parts is to be mentioned. In the bird's eye perspective view of angles $2\theta=45°$ and $\phi=0°$, the backward scene of a part 10 mm high is occluded for a range 10 mm long. To overcome occlusion, the stage of an embodiment of the present invention is equipped with a PCB pose controller including a turntable and a translator.

The translator is able to horizontally translate the turntable along the $y_w$ axis of the world coordinate system. Every part of a PCB is positioned at a place directly under mirror M through combined operations of the turntable and the translator to attain a top view with no occlusion (see FIG. 7A).

A stage of another embodiment of the present invention is equipped with a tilting device and able to tilt the turntable to obtain a top view. A top view is attained by tilting a PCB viewed in angles $2\theta=45°$ and $\phi=0°$ by angles $\xi=45°$, $\eta=0°$, and $\zeta=0°$ (see FIG. 7B).

Next, a device for illuminating a PCB during inspection is to be mentioned. As the view axis is active and the PCB pose and position are variable, embodiments of the present invention are equipped with white light sources widely distributed over the PCB so as to catch specular reflection lights from solder joints on the PCB.

As for teaching PCB information, inspection point addresses are taught utilizing part-mount address data, part shape data, and computer aided design (CAD) data. Also are taught the centroid of the PCB and its poses during inspection.

Next, layout of inspection areas is to be mentioned. Embodiments of the present invention are equipped with a program for layout of inspection areas. Using part-mount and soldering point addresses of a PCB, pleural soldering points are automatically grouped in an inspection area, which is then enclosed with a rectangular frame. The active vision system images the inspection area and displays it on a monitor screen. The rectangular frame is metamorphosed into a trapezoid in accordance with Expression 8 for real angular bird's eye transformation, and then it is superimposed on the displayed real image. Watching the screen, an operator manually modifies the trapezoidal area to obtain suitable size and shape.

Next, evaluating soldering quality is to be mentioned. An inspection system of an embodiment of the present invention carries a program for automatically extracting inspection points, a program for orthogonal transformation of perspective images, a program for calculating discriminative parameters used for evaluating part-mount and soldering quality, and an algorithm for evaluation.

In the teaching mode, an embodiment of the present invention automatically extracts inspection points by processing inspection area image signals. In the inspection mode, an embodiment of the present invention morphs perspective images of the inspection points into orthogonal style images and calculates discriminative parameters therefrom. Then, an embodiment of the present invention evaluates part-mount and soldering quality by feeding the discriminative parameters into the algorithm for evaluation.

Based on the evidences mentioned above, constitution and performance of a perspective viewing inspection system of an embodiment of the present invention are to be described referring to a schematic diagram showing system constitution (FIG. 3) and schematic illustrations depicting PCB poses with respect to the viewing angle (FIG. 7).

FIG. 3 demonstrates PCB 1 and electronic part 2 mounted thereon. PCB 1 is held with a stage which is equipped with a turntable (not shown). In top views shown below the side view in FIG. 3, PCB 1 denotes an original pose, PCB 1' denotes a pose after horizontal turn by $45°$, and PCB 1" denotes a pose after horizontal turn by $-135°$. Active vision system 3 and active mirror 4 are positioned over PCB 1. Active vision system 3 is composed of imaging device 3a and active optical system 3b. Active vision system 3 and active mirror 4 are connected to control system 5 which consists of subunit 6 for active mirror control, subunit 7 for active lens system control, subunit 8 for imaging control, unit 9 for integrated control of subunits 6–8, unit 10 for control of the total system, unit 11 for image processing, and memory 12. Units 9, 10, 11, and memory 12 interact each other via bus 17. Control system 5 is connected to input unit 13, output unit 14, communication unit 15, or display unit 16.

FIG. 7 show the geometry of active mirror 4 with respect to PCB 1 in a translated position and in a tilted pose. FIG. 7A is a schematic side view of electronic part 2a on PCB 1a translated to a place directly under active mirror 4. FIG. 7B is a schematic side view of electronic part 2b on PCB 1b tilted by angle $45°$.

Figure 4:
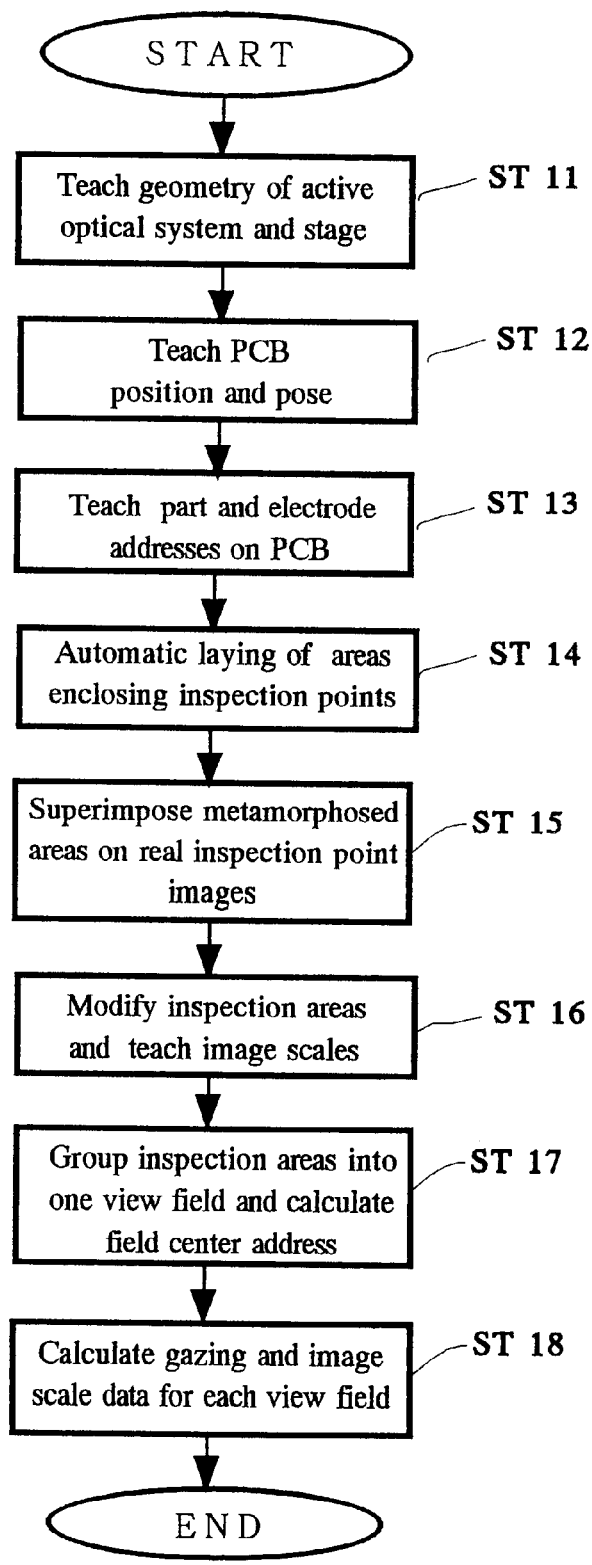
FIG. 4 is a flow diagram showing steps of teaching involved in a perspective viewing inspection system of an embodiment of the present invention.

Steps of teaching is to be mentioned according to a flow diagram shown in FIG. 4. First, an operator teaches the geometry of active optical system 3b and the stage (not shown) (ST 11) and also the position and the pose of the PCB (ST 12). Next, utilizing part mount data, part shape data, and PCB CAD data, he/she teaches the addresses for mounting parts and the electrode addresses corresponding to soldering inspection points (ST 13). An inspection system of an embodiment of the present invention automatically gathers several inspection points into an inspection area and encloses it with a rectangular frame (ST 14). An embodiment then images the area and displays it on a monitor screen. By calculating view-angle dependent perspective transformation, an embodiment of the present invention automatically metamorphoses the rectangular frame into a trapezoid with corresponding angular bird's eye perspective shape and superimposes it on the real inspection area image (ST 15). Watching the real inspection point images, the operator manually modifies size and shape of the superimposed trapezoid and then teaches magnification for imaging (ST 16). After gathering several inspection areas into one view field, an embodiment of the present invention calculates the centroid address of the view field (ST 17) and also the gaze control data and the magnification data for the view field (ST 18).

Figure 5:
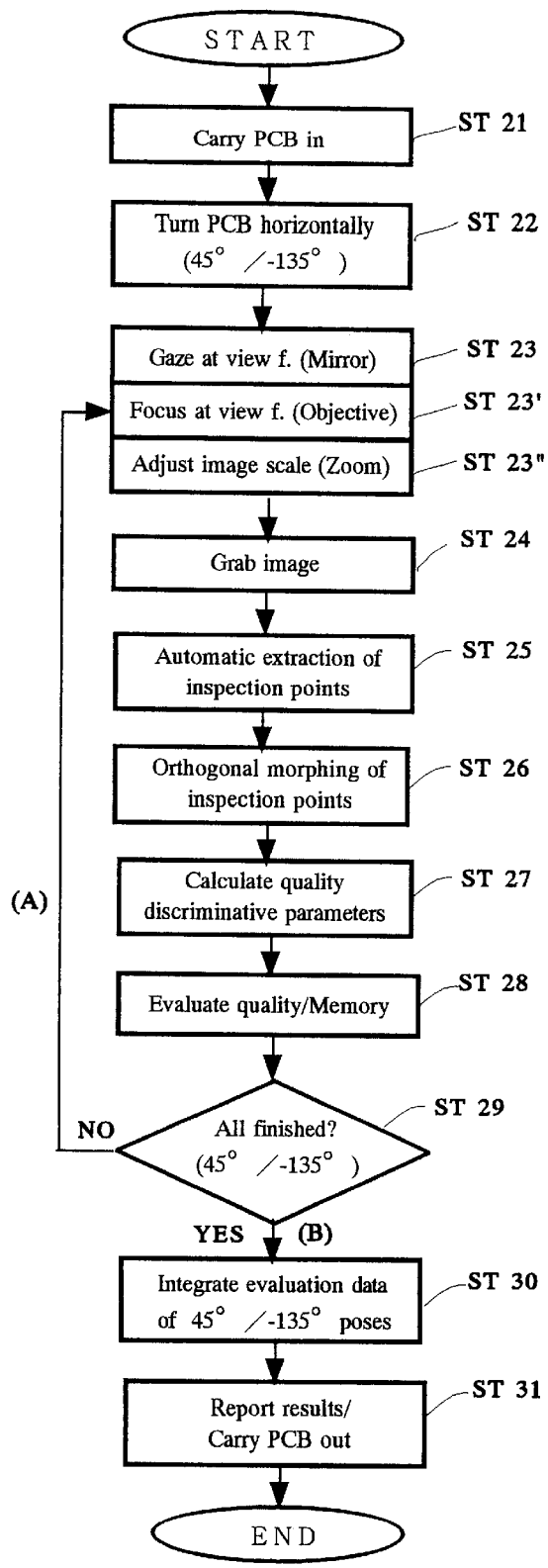
FIG. 5 is a flow diagram showing steps of horizontal turn of a PCB and steps of automatic inspection involved in a perspective viewing inspection system of an embodiment of the present invention.

Steps of automatic inspection is to be mentioned along a flow diagram of FIG. 5. After the PCB is carried in (ST 21), the stage chucks the PCB and turns it by horizontal angle 45° about the centroid (ST 22) (see PCB 1' and electronic part 2' shown in FIG. 3). According to the taught data, an inspection system of an embodiment of the present invention points at a view field by moving active mirror 4 (ST 23), focuses on there by translating active objective $L_1$ (ST 23'), and adjusts the magnification by zooming of zoom lens $L_3$ (ST 23"). Then an embodiment grabs the view field image (ST 24), automatically extracts the inspection points from each inspection area (ST 25), morphs the perspective image into an orthogonal style (ST 26), calculates the discriminative parameters for each point (ST 27), evaluates part-mount and soldering quality of each point, and stores the evaluation data in memory (ST 28).

When inspection of all inspection areas in the 45° turn pose was finished, the system turns the PCB by horizontal angle −135° (see PCB 1" and electronic part 2" shown in FIG. 3) and performs inspection again over all inspection areas (ST 23~ST 28). When inspection of all inspection areas is accomplished in the 45° and −135° poses, ST 29 turns into YES. Then an embodiment integrates the evaluation data for every inspection point in both poses (ST 30), reports the results, and finally carries out the PCB (ST 31).

Figure 6:
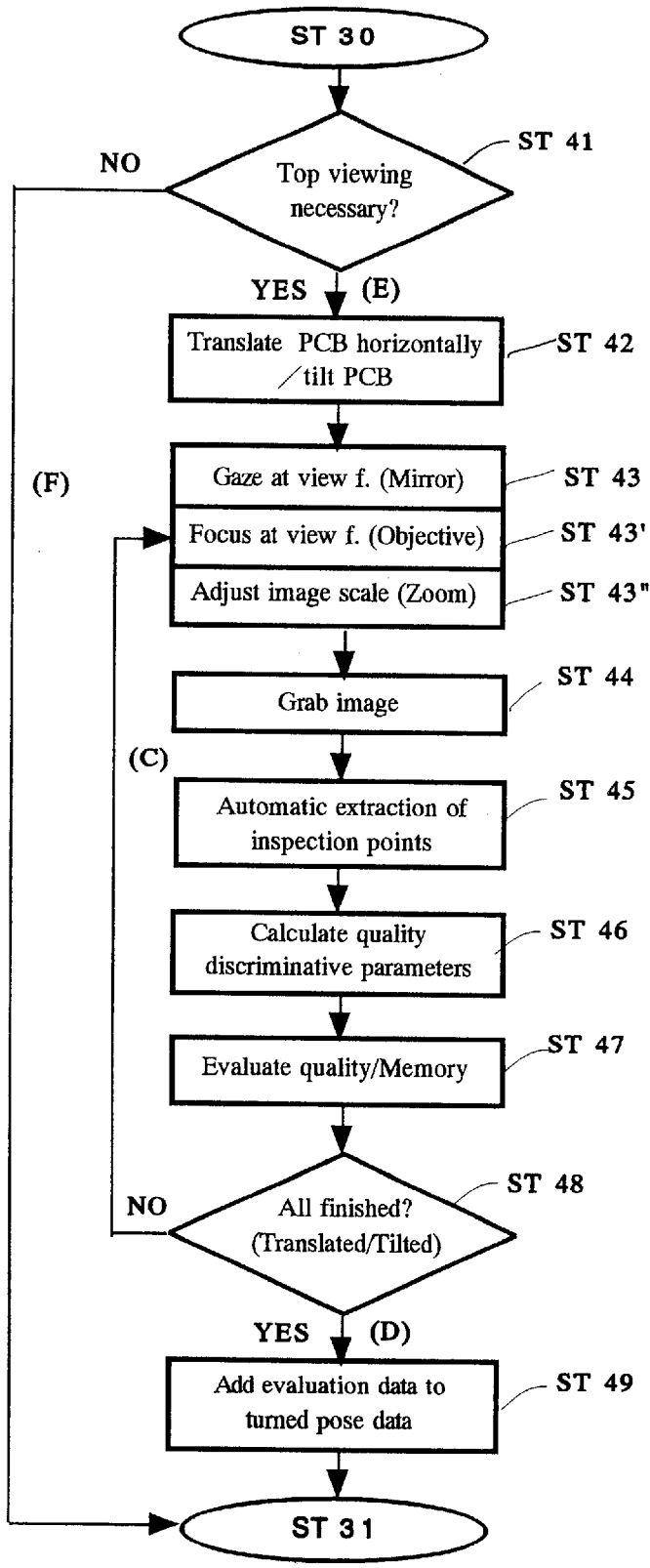
FIG. 6 is a flow diagram showing steps of horizontal translation and/or tilting of a PCB and steps of automatic inspection involved in a perspective viewing inspection system of an embodiment of the present invention.

Next, automatic top view inspection of a PCB mounted with tall parts such as electrolytic condensers is to be mentioned along a flow diagram of FIG. 6 and referring to PCB side views of FIG. 7. In a perspective view, tall parts occlude solder joints behind them. For inspection areas with no occlusion, automatic inspection is performed according to the flow from ST 22 to ST 30 of FIG. 5. For inspection areas with occlusion, ST 41 turns into YES and an embodiment of the present invention either horizontally translates the PCB to a place directly under active mirror 4 as is shown in FIG. 7A or tilts it by angle 45° about the X axis as is shown in FIG. 7B (ST 42). Subsequently, an embodiment performs automatic inspection in the translated position or in the tilted pose (ST 43~ST 47). The inspection steps are similar to those for a horizontally turned PCB except that there is no need for morphing because of the orthogonal projection. When automatic inspection of all inspection areas is accomplished, ST 48 turns into YES. An embodiment adds the evaluation data to those in the horizontally turned poses (ST 49) and enters into ST 31 shown in FIG. 5.

Figure 8:
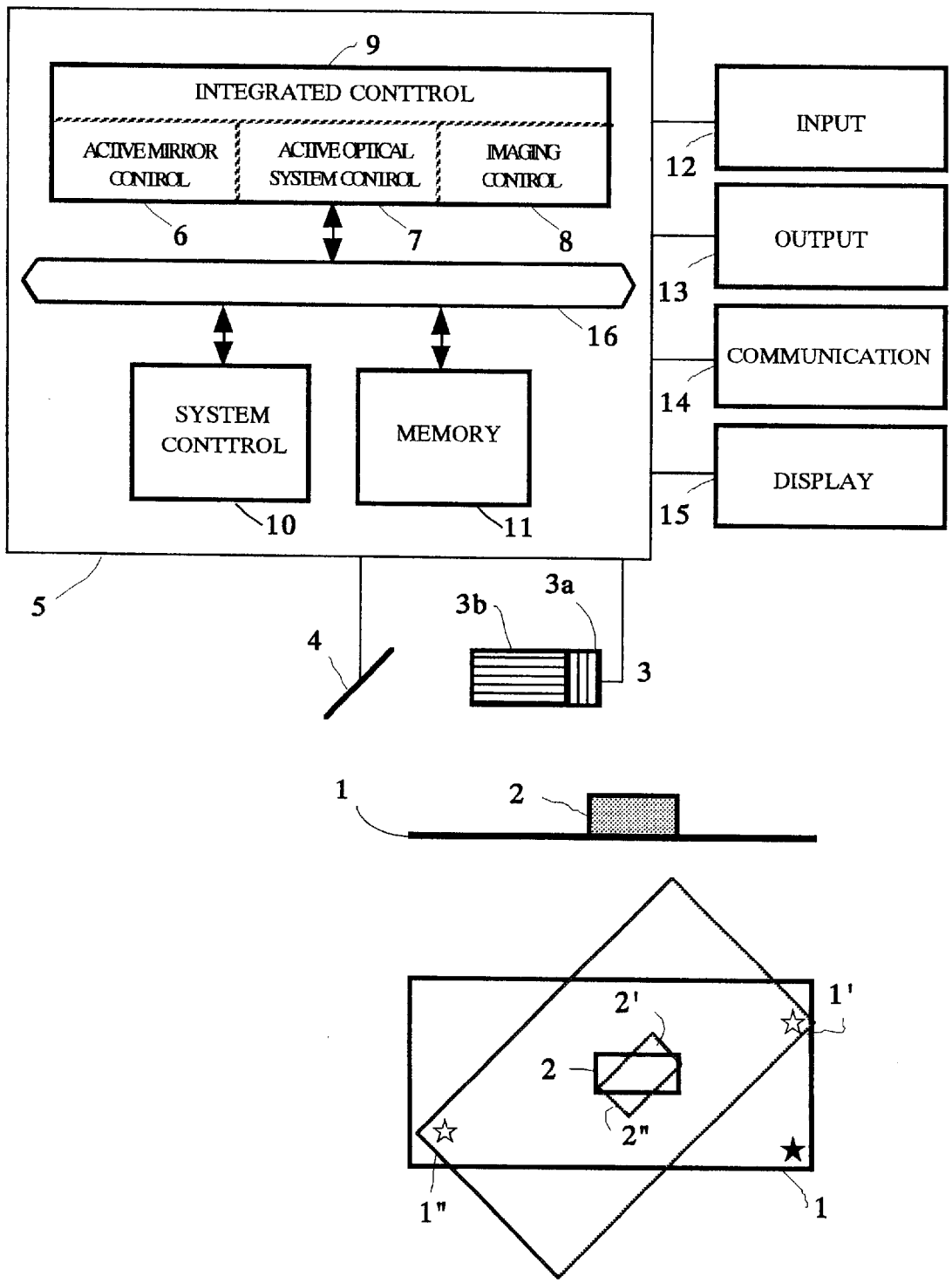
FIG. 8 is a schematic diagram showing system constitution and horizontally turned poses of a PCB involved in a perspective viewing inspection system of another embodiment of the present invention.

Constitution of an inspection system of another embodiment of the present invention and horizontally turned poses of a PCB are schematically demonstrated in FIG. 8. An inspection system of another embodiment grabs images of soldered electronic parts 2 mounted on PCB 1 using active vision system 3 similar to that in an inspection system of first embodiment and displays angular bird's eye perspective images on a monitor screen. An inspector watches the displayed image and evaluates the part-mounting and soldering quality. Constitution of an inspection system of another embodiment is also similar to that of first embodiment shown in FIG. 3 except that another embodiment lacks image processing unit 11 in control system 5.

Figure 9:
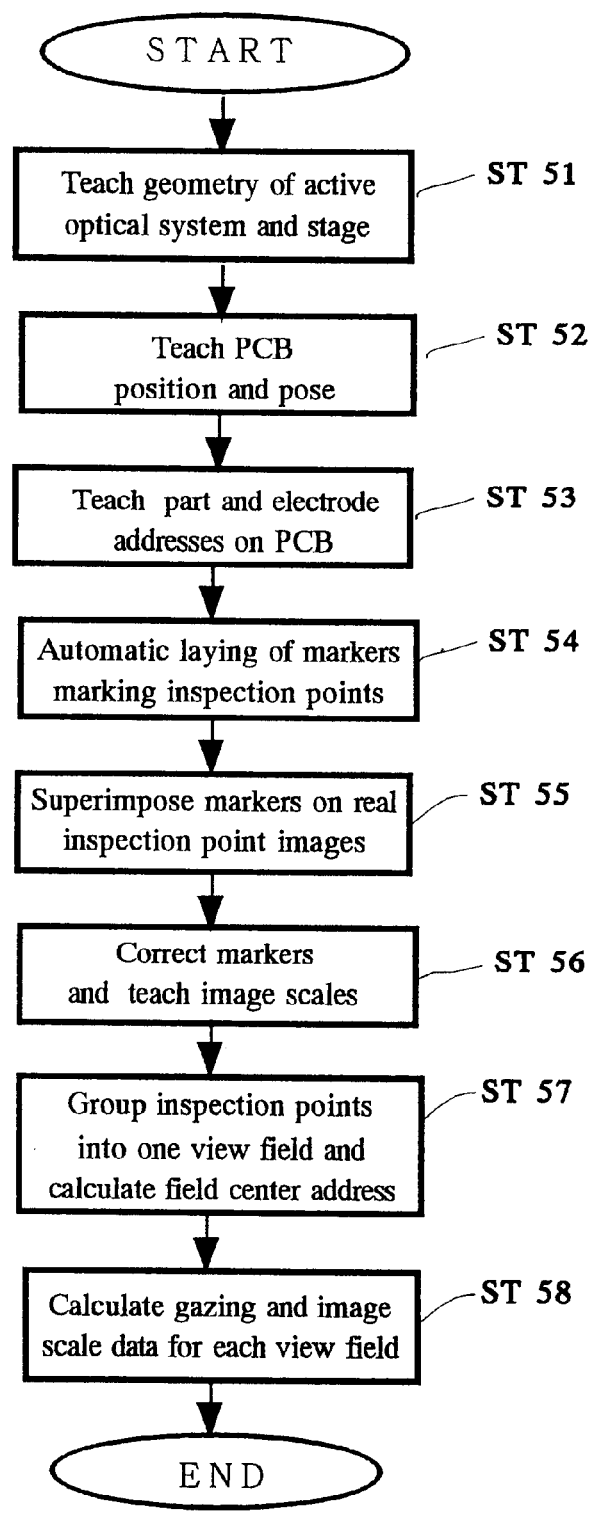
FIG. 9 is a flow diagram showing steps of teaching involved in a perspective viewing inspection system of another embodiment of the present invention.

As hardware constitution of the active vision system of another embodiment is quite similar to active vision system 3 of first embodiment, explanation is to be omitted and only the operation is to be mentioned. Steps in the teaching mode is denoted in a flow diagram of FIG. 9. First, an inspector teaches the geometry including active optical system 3b and a stage (not shown) (ST 51) and also the position and the pose of the PCB (ST 52). Next, utilizing part-mount data, part shape data, and PCB CAD data, he/she teaches the part addresses and the electrode addresses corresponding to soldering inspection points (ST 53). An inspection system of another embodiment automatically lays out a marker marking the inspection points (ST 54). Another embodiment then images the PCB, displays inspection point images on a monitor screen, and superimposes a marker marking the inspection point images (ST 55). The inspector manually corrects positions of the superimposed marker referring to the real inspection point images and then teaches magnification (ST 56). After gathering several inspection points into one view field, an inspection system of another embodiment calculates the centroid address of the view field (ST 57) and also the gaze control data and the magnification data for the view field (ST 58).

Figure 10:
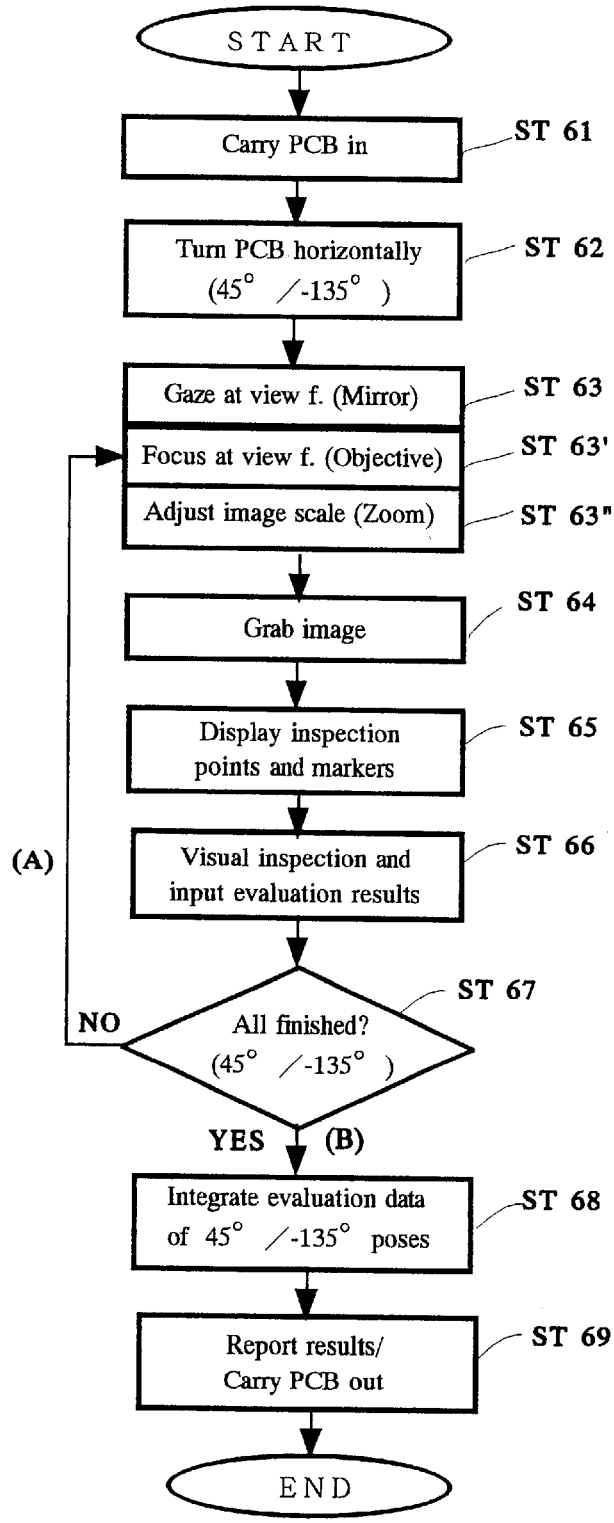
FIG. 10 is a flow diagram showing steps of horizontal turn of a PCB and steps of visual inspection involved in a perspective viewing inspection system of another embodiment of the present invention.
Figure 11:
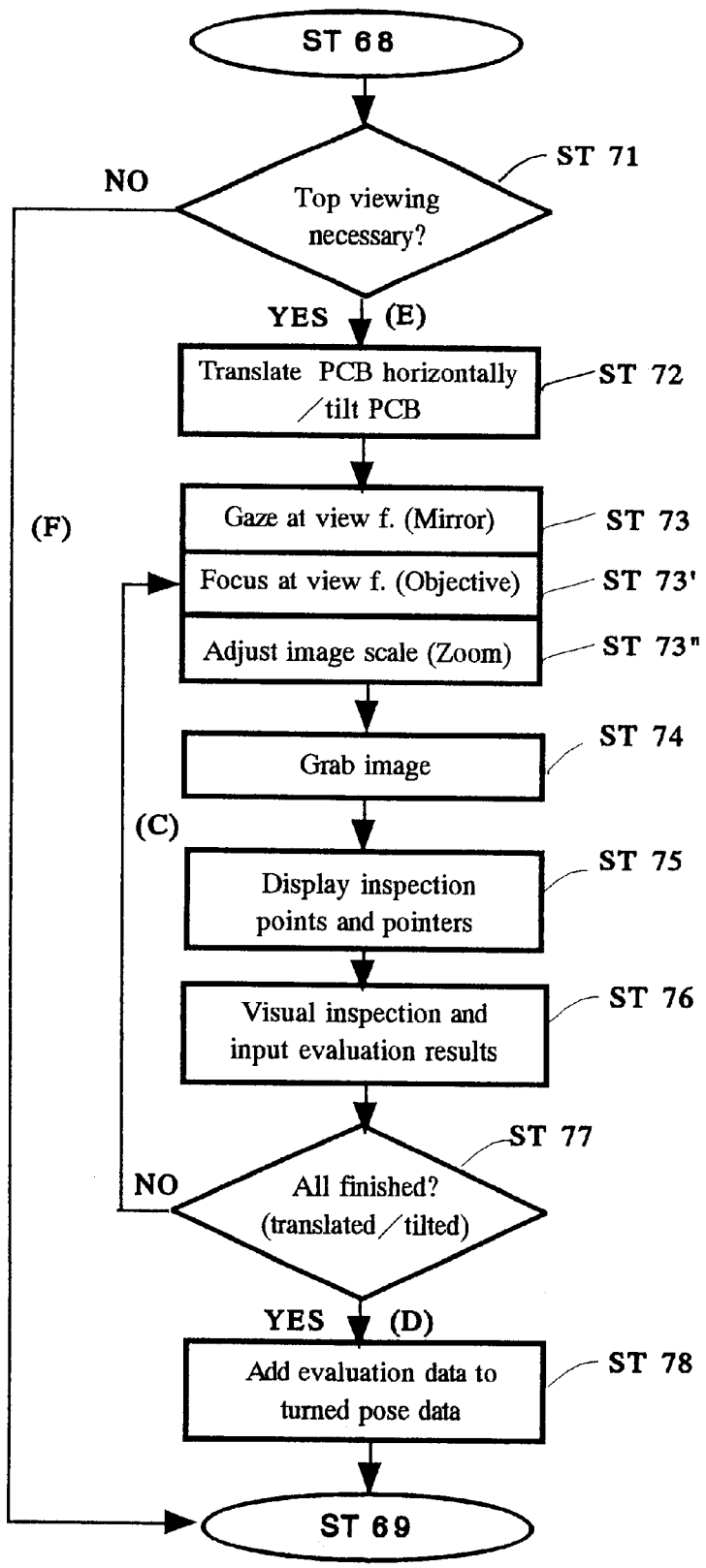
FIG. 11 is a flow diagram showing steps of horizontal translation and/or tilting of a PCB and steps of visual inspection involved in a perspective viewing inspection system of another embodiment of the present invention.

Steps of visual inspection is to be mentioned along a flow diagram of FIG. 10. After the PCB is carried in (ST 61), the stage chucks the PCB and turns it by horizontal angle 45° about the centroid (ST 62) (see PCB 1' and electronic part 2' shown in FIG. 8). According to the taught data, another embodiment gazes at the view field by moving active mirror 4 (ST 63), focuses on there by translating active objective $L_1$ (ST 63'), and adjusts the magnification by zooming of zoom lens $L_3$ (ST 63"). Then another embodiment grabs the field image (ST 64), displays it on a monitor screen, and superimposes the marker thereon (ST 65). The inspector performs visual inspection watching the displayed image, evaluates the part-mount and soldering quality, and then inputs the evaluation results (ST 66).

When inspection of all the inspection points was finished in the 45° turn pose, another embodiment turns the PCB by horizontal angle −135° (see PCB 1" and electronic part 2" shown in FIG. 8). Another embodiment gazes at the view field, grabs the field image, displays it on a monitor screen, and superimposes the marker thereon. The inspector performs visual inspection again on all the inspection points (ST 63~ST 66). When visual inspection of all inspection points in the 45° and −135° poses is accomplished, ST 67 turns into YES. Then another embodiment integrates the evaluation data for every part in both poses (ST 68), reports the evaluation results, and finally carries out the PCB (ST 69).

Next, visual top view inspection of a PCB mounted with tall parts such as electrolytic condensers is to be mentioned according to a flow diagram of FIG. 1 and referring to PCB side views of FIG. 7. In a perspective view, tall parts occlude solder joints behind them. For inspection points with no occlusion, the visual inspection of a PCB is performed according to the flow from ST 62 to ST 68 of FIG. 10. For inspection points with occlusion, ST 71 turns into YES and an inspection system of another embodiment either horizontally translates the PCB to a place directly under active mirror 4 as is shown in FIG. 7A or tilts it by angle 45° about the X axis as is shown in FIG. 7B (ST 72). Subsequently, the inspector performs visual inspection in the translated position or in the tilted pose (ST 73~ST 76). The inspection steps are similar to those for a horizontally turned PCB (see ST 63~ST 66 of FIG. 10). When visual inspection of all inspection areas is accomplished, ST 77 turns into YES. Another embodiment adds the evaluation data to those in the horizontally turned poses (ST 78) and enters into ST 69 shown in FIG. 10.

An inspection system of third embodiment of the present invention which is equipped with an off-line teaching means is to be mentioned. Third embodiment has basically same constitution as that of first embodiment but it has further an off-line function of making an inspection program and also a function of transferring it to an in-line inspection system.

Figure 12:
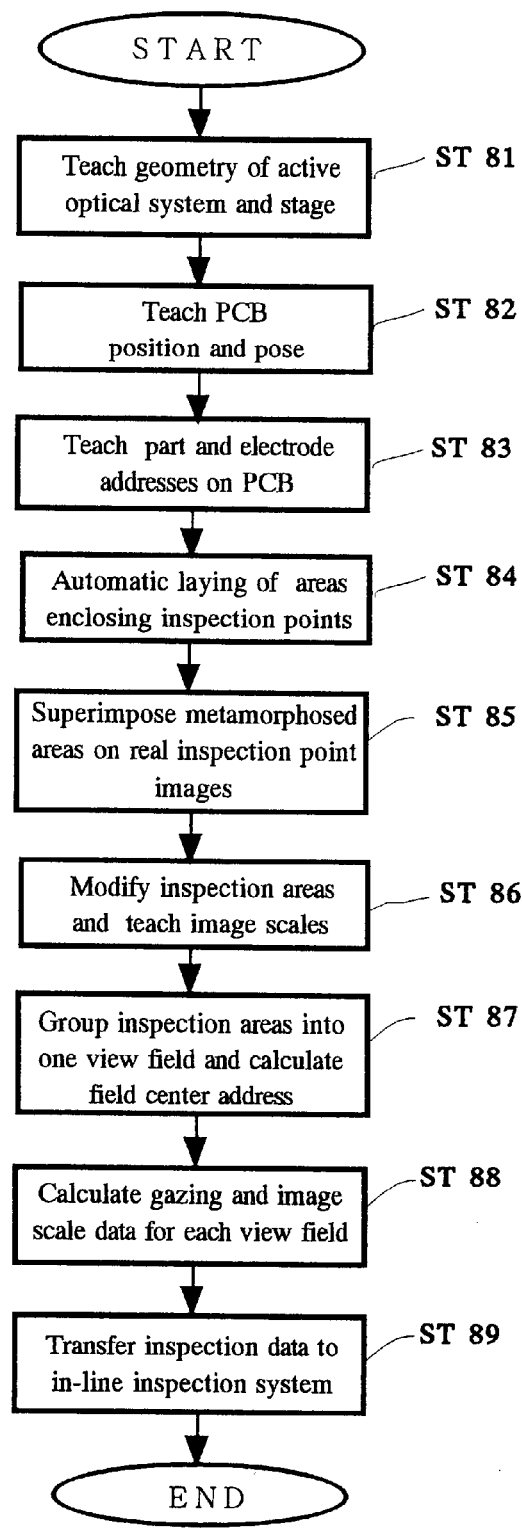
FIG. 12 is a flow diagram showing steps of making inspection sequence data in an off-line inspection system and of transferring them to an in-line inspection system involved in a perspective viewing inspection system of yet another embodiment of the present invention.

Steps of operation of an off-line inspection system of third embodiment is to be mentioned along a flow diagram of FIG. 12. First, an operator teaches the geometry of the active optical system 3b and the stage (not shown) (ST 81) and also the position and the pose of the PCB (ST 82). Next, part-mount data, part shape data, and PCB CAD data, he/she teaches the part-mount and electrode addresses corresponding to soldering inspection points (ST 83). Third embodiment of the present invention automatically gathers several inspection points into an inspection area and encloses it with a rectangular frame (ST 84). The inspection system then images the inspection area and displays it on a monitor screen. By calculating view angle dependent perspective transformation, third embodiment automatically metamorphoses the rectangular frame into a trapezoid with corresponding angular bird's eye perspective shape and superimposes it on the displayed real inspection area image (ST 85). The operator manually modifies size and shape of the superimposed trapezoid referring to the real inspection point images and then teaches magnification (ST 86). After gathering several inspection areas into one view field, an off-line inspection system of third embodiment-calculates the centroid address of the view field (ST 87) and also the gaze control data and the magnification data for the view field (ST 88). Finally, an off-line inspection system of third embodiment transfers the inspection program thus produced to at least one in-line inspection system (ST 89).

What is claimed is:

1. A perspective viewing inspection system utilizing perspective view images obtained with coordinated operations of an active vision system and a stage comprising:

an active optical system for bird's eye perspective viewing of solder joints joining electronic parts with a printed circuit;

a stage able to hold a printed circuit board (PCB) in such a pose that said active optical system has angular perspective views of electronic parts and solder joints on the PCB;

teaching means for teaching the positions and the poses of the PCB during inspection and also the addresses of the electronic parts and the part's electrodes on the PCB;

means for making an inspection program including layout of the inspection areas enclosing several inspection points;

means for imaging including said active optical system;

means for coordinating operations of said active optical system and said stage so that said means for imaging acquires angular bird's eye perspective view images of the inspection points on the PCB; and means for automatically evaluating part-mounting and soldering quality using the inspection point images acquired therewith.

2. A perspective viewing inspection system utilizing perspective view images obtained with coordinated operations of an active vision system and a stage comprising:

an active optical system for bird's eye perspective viewing of solder joints joining electronic parts with a printed circuit;

a stage able to hold a PCB in such a pose that said active optical system has angular perspective views of electronic parts and solder joints on the PCB;

teaching means for teaching the positions and the poses of the PCB during inspection and also the addresses of the electronic parts and the part's electrodes on the PCB;

means for making an inspection program including layout of the inspection areas enclosing several inspection points;

means for imaging including said active optical system;

means for coordinating operstions of said active optical system and said stage so that said means for imaging acquire angular bird's eye perspective view images of the inspection points on the PCB;

display means for displaying the inspection point images acquired therewith;

means for superimposing markers marking the displayed inspection point images; and means for inputting evaluation results obtained by watching the displayed inspection point image.

3. The perspective viewing inspection system set forth in claim 1 or claim 2 wherein said active optical system is positioned over said stage so that said means for imaging acquires bird's eye perspective view images of a PCB and wherein said active optical system is provided with an active mirror device capable of moving a mirror to point the viewing axis at a view field involving inspection areas by mirror reflection according to a command for mirror deflection based on the view field address, with an active telescopic device having an objective and an ocular capable of translating the objective along the viewing axis so as to focus at the view field, forming its aerial figure and relaying it to a subsequent magnification adjuster, according to a command for objective translation based on the view field address, and with a magnification adjuster having a zoom lens capable of adjusting the magnification of the aerial figure into a taught magnification according to a command for magnification adjustment based on the view field address.

4. The perspective viewing inspection system set forth in claim 3 wherein the objective of said active telescopic device is an achromatic lens having long lens focal length.

5. The perspective viewing inspection system set forth in claim 3 wherein said active mirror device is provided with a surface mirror, a device for azimuth mirror deflection, and a device for inclination mirror deflection, wherein said device for azimuth mirror deflection is able to turn said surface mirror about an axis of horizontal pivot holding said surface mirror in such a way that the extended axis passes the mirror surface, and wherein said device for azimuth mirror deflection is able to turn said device for inclination mirror deflection about an axis of an upright pivot holding device for inclination mirror deflection in such a way that the extended axis passes the mirror surface in orthogonal crossing with the extended axis of the horizontal pivot of said device for inclination mirror deflection, enabling catadioptric pointing of the viewing axis at a view field involving inspection areas.

6. The perspective viewing inspection system set forth in claim 1 or claim 2 wherein white light sources are widely distributed over a PCB for illuminating the PCB during inspection.

7. The perspective viewing inspection system set forth in claim 1 or claim 2 wherein said stage is provided with a turntable for horizontal turn of a PCB to provide an angular perspective view of solder joints for said means for imaging.

8. The perspective viewing inspection system set forth in claim 1 or claim 2 wherein said stage is provided with a turntable for horizontal turn of a PCB and a horizontal translator of said turntable to provide a top view of solder joints for said means for imaging.

9. The perspective viewing inspection system set forth in claim 1 or claim 2 wherein said stage is provided with a turntable for horizontal turn of a PCB and a device for tilting said turntable to provide a top view of solder joints for said means for imaging.

10. The perspective viewing inspection system set forth in claim 1 or claim 2 wherein said teaching means is provided with a teaching program able to utilize electronic part mount data, electronic part's shape data, and computer aided design (CAD) data for a PCB.

11. The perspective viewing inspection system set forth in claim 1 wherein said means for making an inspection program is provided with an inspection area laying program to automatically lay out an inspection area so as to involve soldering inspection points and to enclose them with a rectangular frame according to taught data, with a metamorphosing program to metamorphose the rectangular frame into a trapezoidal frame according to the same perspective transformation as the corresponding real image, and with a superimposing program to superimpose the trapezoidal frame on a displayed real inspection area image, enabling manual modification of size and shape of the inspection area.

12. The perspective viewing inspection system set forth in claim 1 wherein said means for evaluating part-mounting or soldering quality is provided with an image-processing program for extracting soldering inspection points from inspection area image signals captured with said means for imaging, with a morphing program for orthogonal morphing of perspective inspection point images extracted therewith, with a calculation program for calculating quality discriminative parameters from inspection point image signals, and with an evaluation program for evaluating part-mounting or soldering quality of each inspection point using the quality discriminative parameters.

13. The perspective viewing inspection system set forth in claim 1 consisting of one perspective viewing inspection system for off-line use and at least another perspective viewing inspection system for in-line use wherein said perspective viewing inspection system for off-line use is provided with off-line teaching system including said active optical system, said stage, said teaching means, said means for making an inspection program, said means for imaging, said means for coordinating operations of said active optical system and said stage, and means for communication, enabling off-line making of an inspection program for a PCB and transferring it to said perspective viewing inspection system for in-line use.

14. The perspective viewing inspection system set forth in claim 13 wherein said means for making an inspection program is not only provided with a program for automatic laying of inspection areas to lay out an inspection area involving soldering inspection points but also provided with a program for manual laying of inspection areas.

* * * * *